United States Patent
Chen

(10) Patent No.: US 7,512,022 B2
(45) Date of Patent: Mar. 31, 2009

(54) NON-VOLATILE MEMORY STRUCTURE

(75) Inventor: Te-Wei Chen, Chupei (TW)

(73) Assignee: Siliconmotion Inc., Hsinchu County (TW)

( * ) Notice: Subject to any disclaimer, the term of this patent is extended or adjusted under 35 U.S.C. 154(b) by 0 days.

(21) Appl. No.: 11/508,248

(22) Filed: Aug. 23, 2006

(65) Prior Publication Data
US 2007/0297230 A1 Dec. 27, 2007

(30) Foreign Application Priority Data
Jun. 27, 2006 (TW) .............................. 95123218 A

(51) Int. Cl.
*G11C 11/00* (2006.01)
(52) U.S. Cl. ...................... 365/200; 365/205
(58) Field of Classification Search ................. 365/200, 365/205
See application file for complete search history.

(56) References Cited

U.S. PATENT DOCUMENTS 5,023,839 A * 6/1991 Suzuki et al. .......... 365/185.21
6,751,131 B2 * 6/2004 Yamano ................ 365/189.07
6,950,353 B1 * 9/2005 Kim et al. .................... 365/200
6,978,535 B2 * 12/2005 Tien ............................ 29/748
6,992,911 B2 * 1/2006 Takahashi .................... 365/145
2002/0097623 A1 * 7/2002 Suzuki et al. ................ 365/210
2003/0202412 A1 * 10/2003 Nii et al. ..................... 365/210
2004/0242009 A1 * 12/2004 Banks ......................... 438/701
2004/0246793 A1 * 12/2004 Yamagami ................... 365/200
2005/0278073 A1 * 12/2005 Roth .......................... 700/282
2007/0016738 A1 * 1/2007 Hosono et al. .............. 711/156

* cited by examiner

*Primary Examiner*—Michael T Tran
(74) *Attorney, Agent, or Firm*—Rosenberg, Klein & Lee

(57) ABSTRACT

A non-volatile memory array structure includes N bit lines, M first word lines, M×N first memory cells, a second word line, n repair circuits and a sense amplifier. The N bit lines and M first word lines are interlaced to control the M×N first memory cell. The second word line is placed across the n bit lines. Each of the repair circuits is electrically connected between the corresponding bit line and the sense amplifier. M and N are natural number.

10 Claims, 3 Drawing Sheets

NON-VOLATILE MEMORY STRUCTURE

RELATED APPLICATIONS

The present application is based on, and claims priority from, Taiwan Application Serial Number 95123218, filed Jun. 27, 2006, the disclosure of which is hereby incorporated by reference herein in its entirety.

BACKGROUND

1. Field of Invention

The present invention relates to nonvolatile memory array. More particularly, the present invention relates to nonvolatile memory array without a fuse.

2. Description of Related Art

Non-volatile memory devices, such as flash, include a floating gate to store electric charge and a charge input/output control unit. Flash can be used for Basic Input Output System (BIOS) of a computer, high-density non-volatile memory array can be applied to mass storage devices in a portable Terminal Server, digital camera and memory card of a computer. Non-volatile memory has a lot of advantages, such as quick operation time, low power consumption and durability. A chip probing process is taken to test if the non-volatile memory functions after the non-volatile memory is manufactured, and the broken cell must be repaired or separated to avoid affecting all of the non-volatile memory.

FIG. 1 is a schematic view of a conventional non-volatile memory array. A non-volatile memory array 100 includes a sense amplifier 101, metal fuses 103, bit lines 105, a first word line 111 and first memory cells 113. In the non-volatile memory array 100, each bit line 105 is electrically connected to the sense amplifier 101 through a metal fuse 103. First word lines 111 and bit lines 105 are interlaced to control the first memory cells 113. Because the structure of every bit line 105 is the same, the bit line 105a and the corresponding circuit on it are used as an example for explaining.

In FIG. 1, bit line 105a is electrically connected to the unit sense amplifier 117a through the metal fuse 103a. M word lines 111 and one bit line 105a control the m memory cells 113a. Memory cells 113a are used to store data and put the stored date on the bit line 105a. The metal fuses 103a are used to convey the signal from the bit line 105a to the sense amplifier 117a such that the sense amplifier 117 can amplify the signal from the bit line 105a.

When the non-volatile memory is done, generally, there is a first wafer sort stage to test the combinational logic function evaluated by the bit line 105a. If the logic function of the bit line 105a fails, the laser repair machine will trim the metal fuse 103a by laser to disable the connection between bit line 105a and sense amplifier 117a. By doing so, the sole failed bit line 105a affecting the whole Non-volatile memory array 100 can be avoided.

However, additional processes will be needed if the laser trimming method is used. For example, after the failed bit line 105a is identified at the first wafer sort stage, an additional laser trimming step to trim the metal fuse open is needed, followed by an additional second wafer sort stage to test if the trimming works or not such that the whole non-volatile memory 100 can operation correctly. These additional steps make the whole test process more complicated.

For the forgoing reasons, there is a need for a new non-volatile structure that can disable the connection between the failed bit line and the sense amplifier without laser repair and second wafer sort stage to simplify the circuit test process.

SUMMARY

It is therefore an aspect of the present invention to provide a non-volatile memory array structure, which can disable the connection between failed bit lines and the sense amplifier during the first wafer sort stage to omit the laser repair and the second wafer sort process.

According to one embodiment of the present invention, the non-volatile memory array structure includes N bit lines, M first word lines, M×N first memory cells, a second word line, n repair circuits and a sense amplifier. The N bit lines and M first word lines are interlaced to control the M×N first memory cells. The second word line is placed across the n bit lines. M and N are natural number.

Each of the repair circuits is electrically connected between one of the bit lines and the sense amplifier, each of which includes a second memory cell, a first transistor and a second transistor. The first transistor has a drain electrically connected to one of the bit lines, a source electrically connected to the sense amplifier, and a gate electrically connected to the second memory cell. The second transistor has a drain electrically connected to the second memory cell and the gate of the first transistor, a source electrically connected to the sense amplifier.

During the first wafer sort stage, the auto testing equipment turns on the first transistors by writing a first voltage to the second memory cells through the second word line. The testing equipment then tests each of the bit lines and identifies the failed bit lines. Next, the auto testing equipment turns on the second transistors to write a second voltage to the second memory cell to control the first transistor. If the bit line is failed, the second memory cell turns off the corresponding first transistor so that the connection between the failed bit line and the sense amplifier is disabled.

As mentioned above, the connections between the failed bit lines and the sense amplifier is disabled during the first wafer stage, so the laser repair and second wafer sorting process are no longer necessary such that the test can be simpler.

It is to be understood that both the foregoing general description and the following detailed description are examples and are intended to provide further explanation of the invention as claimed.

BRIEF DESCRIPTION OF THE DRAWINGS

These and other features, aspects and advantages of the present invention will become better understood with regard to the following description, appended claims and accompanying drawings where:

DESCRIPTION OF THE EMBODIMENTS

Figure 1:
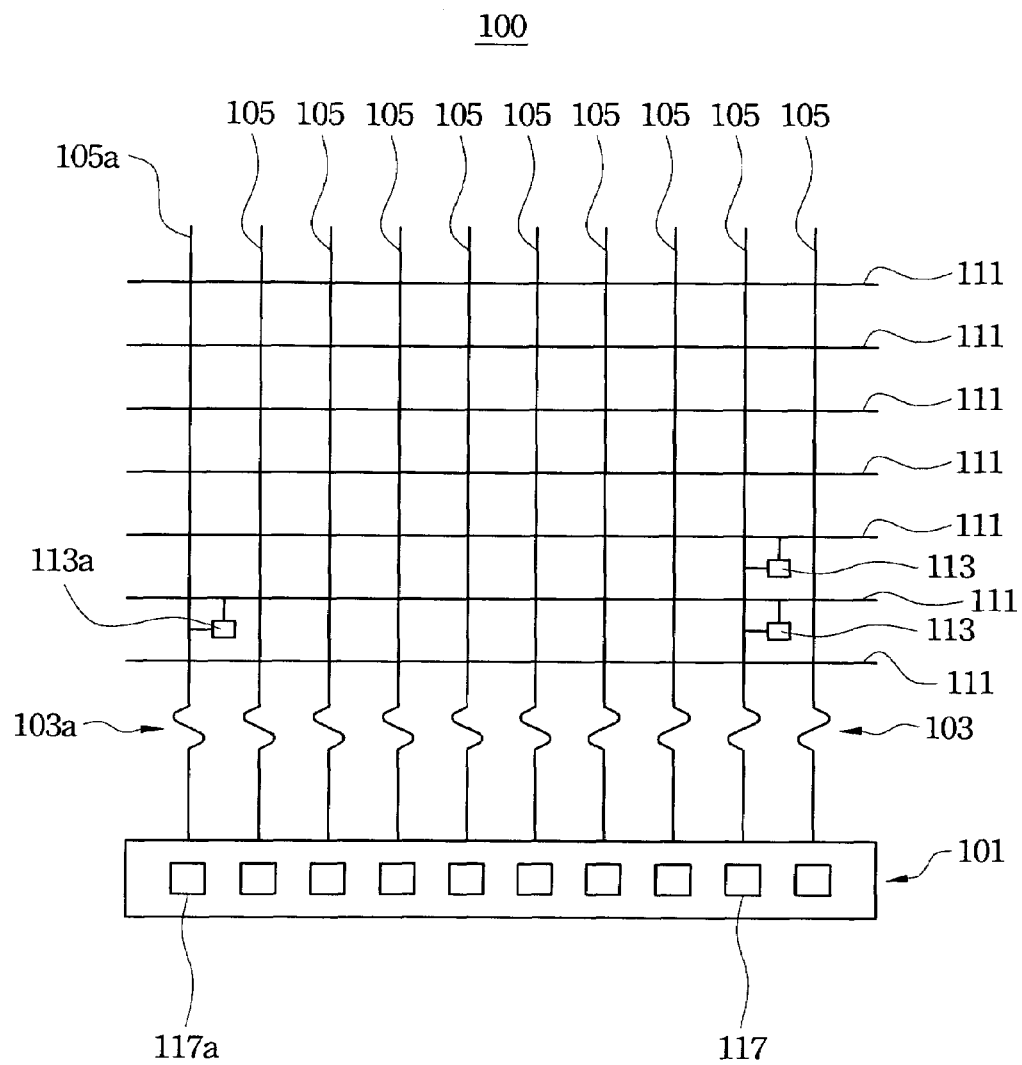
FIG. 1 is a schematic view of a conventional non-volatile memory structure.

Reference is made in detail to the present embodiments of the invention, examples of which are illustrated in the accompanying drawings. Wherever possible, the same reference numbers are used in the drawings and the description to refer to the same or like parts.

Figure 2:
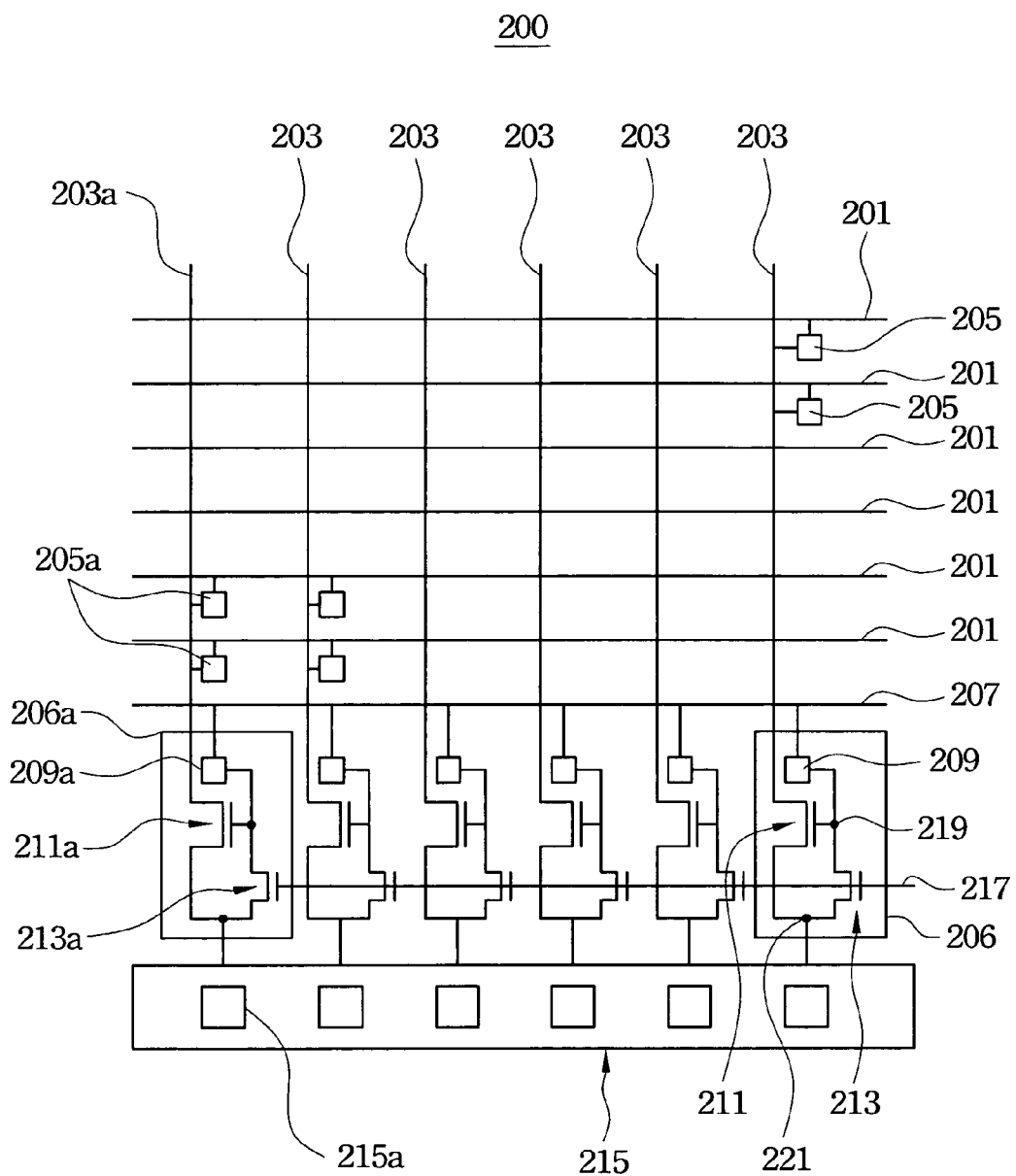
FIG. 2 is a schematic view of a non-volatile memory structure of one embodiment of the present invention.

FIG. 2 is a schematic view of a non-volatile memory structure of one embodiment of the present invention. The non-volatile memory structure 200 includes N bit lines 203, M first word lines 201, M×N first memory cells 205, a second word line 207, n repair circuits 206 and a sense amplifier 215. The N bit lines 203 and M first word lines 201 are interlaced to control the M×N first memory cells 205. The second word line 207 is placed across the n bit lines 203. Among above, the M and N are natural number.

Each repair circuit 206 is electrically connected between one of the bit lines 203 and the sense amplifier 215, each of which includes a second memory cell 209, a first transistor 211 and a second transistor 213. The first transistor 211 has a drain electrically connected to the corresponding bit lines 203, a source electrically connected to the sense amplifier 215, and a gate electrically connected to the second memory cell 209. The second transistor 213 has a gate electrically connected to the enabling line 217, a drain electrically connected to the second memory cell 209 and the gate of the first transistor 211, a source electrically connected to the sense amplifier 215 and the source of the first transistor 211.

Because every bit line 203 has the same structure, the bit line 203a is used as an example. The repair circuit 206a includes a second memory cell 209a, a first transistor 211a and a second transistor 213a. The first side of the second memory cell 209a is electrically connected to the second word line 207, the second side of the second memory cell 209a is electrically connected to the gate of the first transistor 211a and drain of the second transistor 213a. The drain of the first transistor 211a is electrically connected to the bit line 203a, and the source of the first transistor 211a is electrically connected to the source of the second transistor 213a and the unit sense amplifier 215a.

In the non-volatile memory structure 200, each bit line 203a evaluates some combination logic function, to identify if there are failed first memory cells on the bit line 203a and if the bit line 203a evaluates the combination logic function correctly, the auto testing equipment takes the following steps during the first wafer sort stage:

1. Turn on the first transistor 211a and turn off the second transistor to test if there are failed first memory cells on the bit line 203a. During this step, the auto testing equipment turns on the first transistor 211a by writing a first voltage to the second memory cell 209a through the second word line 207, and turns off the second transistor 213a through the enabling line 217. By turning on the first transistor 211a and turning off the second transistor 213a, the auto testing equipment can test the bit line 203a as it used to be.

2. Write a second voltage to the second memory cell. The value of the second voltage is determined according to the correctness of the combination logic function of the bit line 203a. After step 1 is completed, the auto testing equipment turns on the second transistor 213a and disables all the first word lines 201 such that the auto testing equipment can write the second voltage to the second memory cell 209a. The second voltage will turn on the first transistor 211a if the combinational logic function of the bit line 203a is correct, or the second voltage will turn off the first transistor 211a if the bit line 203a fails.

3. Turning off the second transistor 213a such that the connection between the bit line 203a and the unit sense amplifier 215a can be totally controlled by the first transistor 211a which is controlled by the second memory cell 209a.

The non-volatile memory can execute normal read/write operations immediately after the first wafer sort stage listed above. While the non-volatile memory executes normal read/write operations, the enabling line 217 turns off the second transistor 213a to avoid the voltage at the source of first transistor 211a been affected by the second memory cell 209a. In addition, during the normal read/write operation, the second memory cell 209a will turn on the first transistor 209a if the combinational logic function of the bit line 203a is correct, or it will turn off the first transistor 209a if the bit line 203a is failed.

Figure 3:
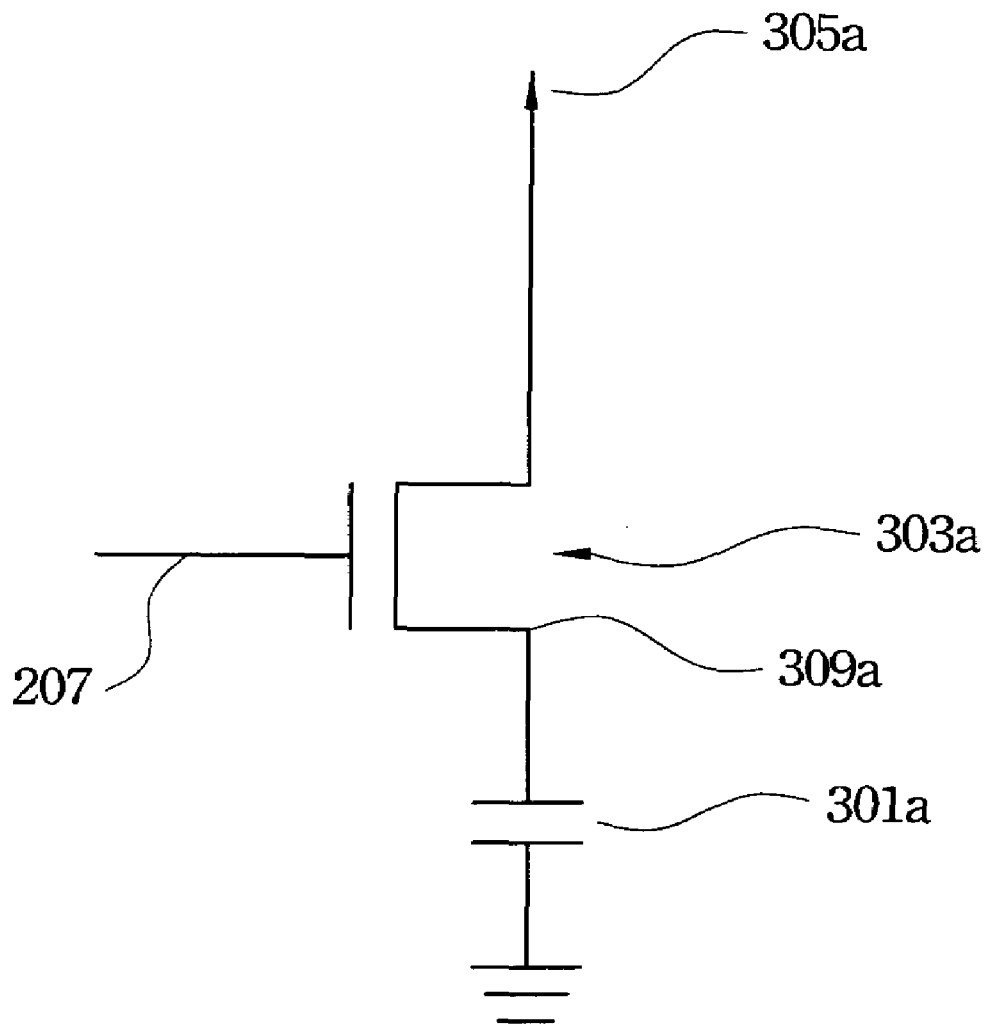
FIG. 3 is a schematic view of the second memory cell of one embodiment of the present invention.

FIG. 3 is a schematic view of a second memory cell 209a of one embodiment of the present invention. The second memory cell 209a still has a lot of different types. One kind of second memory type is used for illustration. The second memory cell 209a includes a third transistor 303a and a capacitor 301a. The drain of the third transistor 303a is electrically connected to the voltage supply 305a, the gate of the third transistor 303a is electrically connected to the second word line 207 which is shown in FIG. 2, the source of the third transistor 303a is electrically connected to the first side 309a of the capacitor 301a and the gate of the first transistor 211a, the second side of the capacitor 301a is electrically connected to the ground.

At the first wafer sort stage as stated above, the auto testing equipment needs to turn on the first transistor 211a to test bit line 203a to identify if bit line 203a is failed, therefore the auto testing equipment turns on the third transistor 303a through the second word line 207 which is electrically connected to the gate of the third transistor 303a such that the voltage supply 305a can charge the capacitor 301a to turn on the first transistor 211a. After testing the functionality of the bit line 203a, the auto testing equipment turns off the third transistor 303a through the second word line 207, and charges or discharges the capacitor 301a through the second transistor 213a according to the function correctness of the bit line 203a. For example, the capacitor 301a will be charged to turn on the first transistor 211a if the function of a bit line 203a is correct, or the capacitor 301a will be discharged to turn off the first transistor 211a.

After the first wafer sort stage, the connection between bit line 203a and unit sense amplifier 215a is made according to the function correctness of the bit line 203a.

In conclusion, the embodiments can disable the connections between the failed bit lines and the sense amplifier during the first wafer stage, so the laser repair and second wafer sorting process are no longer necessary such that the testing process can be more simplified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A non-volatile memory array structure, comprising:
N bit lines and M first word lines interlaced to control M×N first memory cells, wherein the M and N are natural number;
a second word line across the bit lines;
a sense amplifier; and
n repair circuits electrically connected between the bit lines and the sense amplifier, wherein each of the repair circuits comprises:
a second memory cell;
a first transistor with a drain electrically connected to one of the bit lines, a source electrically connected to the sense amplifier, and a gate directly electrically coupled to the second memory cell, wherein the first transistor is controlled by the second memory cell according to the function correctness of the corresponding bit line; and a second transistor with a drain electrically connected to the second memory cell and the gate of the first transistor, a source electrically connected to the sense amplifier.

2. The non-volatile memory array structure as claimed in claim 1, wherein the second memory cell is a storage device which is used for controlling the first transistor.

3. The non-volatile memory array structure as claimed in claim 2, wherein the storage device comprises:
   a third transistor with a gate electrically connected to the second word line; and
   a capacitor having a first side electrically connected to the source of the third transistor.

4. The non-volatile memory array structure as claimed in claim 3, further comprising an enabling line electrically connected to the gate of the second transistor, the enabling line is used to control the second transistor.

5. A repair method, used to separate the failed bit line of the non-volatile memory array structure as claimed in claim 4, comprises:
   writing a first voltage to the second memory cells by the second word line to turn on the first transistors;
   testing the bit lines with an auto testing equipment; and
   turning on the second transistor with the enabling line such that the auto testing equipment can write a second voltage to the second memory cell to control the first transistor.

6. A repair circuit of a non-volatile memory array which includes a plurality of first word lines, a plurality of bit lines, a plurality of first memory cells controlled by the first word lines and the bit lines, and a sense amplifier, each of the repair circuit comprising:
   a second word line;
   a second memory cell, electrically connected to the second word line;
   a first transistor with a drain electrically connected to one of the bit lines, a source electrically connected to the sense amplifier, a gate directly electrically coupled to the second memory cell, wherein the first transistor is controlled by the second memory cell according to the function correctness of the corresponding bit line; and
   a second transistor with a drain electrically connected to the second memory cell and the gate of the first transistor, a source electrically connected to the sense amplifier.

7. The repair circuit as claimed in claim 6, wherein the second memory cell is a storage device.

8. The repair circuit as claimed in claim 7, wherein the storage device comprises:
   a third transistor with a gate electrically connected to the second word line, a drain electrically connected to a voltage source; and
   a capacitor with a first side electrically connected to a source of the third transistor.

9. The repair circuit as claimed in claim 6, further comprising an enabling line, electrically connected to a gate of the second transistor.

10. A non-volatile memory array structure, comprising:
   a plurality of bit lines;
   a plurality of first memory cells electrically connected to the bit lines;
   a sense amplifier; and
   a plurality of repair means for conducting the bit lines to the sense amplifier according to the function correctness of the corresponding bit lines,
wherein each of the repair means comprises:
   a second memory cell storing a voltage, wherein the second memory cell comprises:
      a second transistor electrically connected to the first transistor: and
      a capacitor electrically connected to the second transistor for storing the voltage; and
   a first transistor electrically connected between one of the bit lines and the sense amplifier, wherein the first transistor conducts one of the bit lines to the sense amplifier according to the voltage stored in the second memory cell.

* * * * *